United States Patent
Chen

(10) Patent No.: US 12,089,353 B2
(45) Date of Patent: Sep. 10, 2024

(54) SUPPORT BASE PLATE AND DISPLAY PANEL

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Xia Chen, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 314 days.

(21) Appl. No.: 17/600,216

(22) PCT Filed: Jul. 16, 2021

(86) PCT No.: PCT/CN2021/106941
§ 371 (c)(1),
(2) Date: Sep. 30, 2021

(87) PCT Pub. No.: WO2022/262049
PCT Pub. Date: Dec. 22, 2022

(65) Prior Publication Data
US 2023/0247781 A1    Aug. 3, 2023

(30) Foreign Application Priority Data
Jun. 16, 2021    (CN) .......................... 202110666213.8

(51) Int. Cl.
*H05K 5/02*    (2006.01)

(52) U.S. Cl.
CPC .................. *H05K 5/0217* (2013.01)

(58) Field of Classification Search
CPC ...... G09F 9/301; G06F 1/1641; G06F 1/1616; G06F 1/1681; G06F 1/1637;
(Continued)

(56) References Cited

U.S. PATENT DOCUMENTS

2016/0357052 A1*  12/2016  Kim ................... G02F 1/133308
2018/0150108 A1*   5/2018  Song ..................... H10K 59/40
(Continued)

FOREIGN PATENT DOCUMENTS

| CN | 108428731 A | 8/2018 |
| CN | 109118964 A | 1/2019 |

(Continued)

OTHER PUBLICATIONS

Wang et al. Flexible supporting piece, manufacturing method thereof and display device, Jul. 16, 2021, ESPACENET (Year: 2021).*
(Continued)

*Primary Examiner* — Michael A Matey
(74) *Attorney, Agent, or Firm* — The Roy Gross Law Firm, LLC; Roy Gross

(57) ABSTRACT

A support base plate and a display panel are provided. In embodiments of this application, a support base plate in a bent area is correspondingly disposed as a structure having at least two layers. In the two-layer structure, at least one layer is a hollowed-out structure, and another layer is a support structure. When a flexible display panel is bent or folded, the support base plate provided in the embodiments of this application not only can support the panel, but also can effectively improve the bending performance of the panel, thereby improving the comprehensive performance of the flexible panel.

15 Claims, 5 Drawing Sheets

(58) Field of Classification Search
CPC .......... G06F 1/1601; G06F 1/1618; H10K 2102/311; H05K 7/20954; H05K 1/028; H05K 5/0217; G02F 1/133308; G02F 1/133305

See application file for complete search history.

(56) References Cited

U.S. PATENT DOCUMENTS

| | | | | |
|---|---|---|---|---|
| 2018/0153049 | A1* | 5/2018 | Song | H04M 1/0268 |
| 2018/0190936 | A1* | 7/2018 | Lee | B32B 25/20 |
| 2019/0196641 | A1* | 6/2019 | Ryu | G06F 3/0414 |
| 2019/0207141 | A1* | 7/2019 | Kim | H10K 77/111 |
| 2019/0250663 | A1* | 8/2019 | Park | G06F 1/1618 |
| 2019/0334101 | A1* | 10/2019 | Shang | H10K 71/00 |
| 2019/0350092 | A1* | 11/2019 | Jung | H05K 1/147 |
| 2020/0051881 | A1* | 2/2020 | Park | B32B 3/04 |
| 2021/0118337 | A1* | 4/2021 | Park | G09F 9/301 |
| 2021/0200268 | A1* | 7/2021 | Lee | H10K 50/84 |
| 2021/0373604 | A1* | 12/2021 | Shin | H05K 7/20963 |
| 2021/0407708 | A1* | 12/2021 | Lan | B33Y 80/00 |
| 2022/0413548 | A1* | 12/2022 | Sun | G06F 1/1607 |
| 2023/0176621 | A1* | 6/2023 | Zhou | G06F 1/1681 361/679.01 |

FOREIGN PATENT DOCUMENTS

| | | |
|---|---|---|
| CN | 109148534 A | 1/2019 |
| CN | 109903679 A | 6/2019 |
| CN | 111862824 A | 10/2020 |
| CN | 112150928 A | 12/2020 |
| KR | 20150063802 A | 6/2015 |

OTHER PUBLICATIONS

Wang et al. Flexible supporting piece, manufacturing method thereof and display device, Jul. 16, 2021, PE2E translation with original (Year: 2021).*
PCT International Search Report for International Application No. PCT/CN2021/106941, mailed on Feb. 28, 2022, 6pp.
PCT Written Opinion of the International Searching Authority for International Application No. PCT/CN2021/106941, mailed on Feb. 28, 2022, 7pp.
Chinese Office Action issued in corresponding Chinese Patent Application No. 202110666213.8 dated Dec. 21, 2021, pp. 1-9, 22pp.
Chinese Office Action issued in corresponding Chinese Patent Application No. 202110666213.8 dated Mar. 1, 2022, bages 1-7, 16pp.
Chinese Office Action issued in corresponding Chinese Patent Application No. 202110666213.8 dated May 27, 2022, bages 1-5, 12pp.

* cited by examiner

US 12,089,353 B2

SUPPORT BASE PLATE AND DISPLAY PANEL

CROSS REFERENCE TO RELATED APPLICATIONS

This application is a National Phase of PCT Patent Application No. PCT/CN2021/106941 having International filing date of Jul. 16, 2021, which claims the benefit of priority of Chinese Application No. 202110666213.8 filed on Jun. 16, 2021. The contents of the above applications are all incorporated by reference as if fully set forth herein in their entirety.

FIELD OF INVENTION

This present disclosure relates to the technical field of display panel manufacturing, and more particularly to a support base plate and a display panel.

BACKGROUND OF INVENTION

With the continuous improvement of display panel manufacturing technologies, people have increasingly higher requirements for the quality and use performance of a display panel and a display device.

Nowadays, mainstream display screens mainly include an organic light-emitting diode (OLED) display screen and a liquid crystal display screen. Due to the self-luminous performance of the OLED display screen, compared with the liquid crystal display screen, a backlight module having high power consumption is omitted. Therefore, the OLED display screen has the advantages of more energy saving and environmental protection. In addition, the OLED display screen also has characteristics of being flexible and bendable. Therefore, the flexible OLED is widely used in various devices. In the existing flexible display screen, the flexible screen is generally attached to a support base plate, and each film layer is supported by using the support base plate. When the support base plate is bent under a force, the flexible screen is attached to the support base plate bends as the base plate is bent under the action of the bending stress. However, the conventional support base plate is often thicker, more rigid, and has unsatisfactory bending performance. When the support base plate is bent under a force, the base plate can be bent under a large bending stress. If the bending stress is too large, it is easy to cause the base plate or the flexible panel to warp or break and result in a greater influence especially on a foldable curved panel. Therefore, with the continuous improvement of the performance of the flexible display panel, the requirements for the support base plate also become increasingly higher.

Therefore, it is necessary to provide solutions to the problems in the related art.

SUMMARY OF INVENTION

Technical Problem

Based on the above, when the conventional flexible foldable panel is bent or folded, the support base plate has a relatively large bending resistance. Therefore, a bending effect of the support base plate is not ideal. This is ultimately not conducive to the improvement of the overall performance of the flexible display panel.

Technical Solution

In order to solve the above problems, embodiments of this application provide a support base plate and a display panel, so as to resolve the problem of unsatisfactory bending performance of the support base plate when the support base plate in a conventional flexible display panel is supported or bent.

In order to resolve the above technical problem, the embodiments of this application provide the following technical solutions.

According to a first aspect of the embodiments of this application, a support base plate is provided, comprising: a bending area and a non-bending area, where the bending area is disposed on a side of the non-bending area, and the support base plate correspondingly disposed in the bending area comprises at least two layers, at least one of the two layers is a hollowed-out structure, and a density of the hollowed-out structure in a central area of the bending area is less than a density of the hollowed-out structure in a non-central area of the bending area.

According to an embodiment of this application, the support base plate in the bending area comprises a first support base plate and a second support base plate, the second support base plate is disposed on the first support base plate, and an end portion of the first support base plate is connected to a base plate in the non-bending area.

According to an embodiment of this application, the first support base plate and the second support base plate are both hollowed out to be meshy, and a hollowed-out area of the first support base plate is opposite to a non-hollowed-out area of the second support base plate.

According to an embodiment of this application, the first support base plate is meshy, and the second support base plate is in shape of spaced-strips.

According to an embodiment of this application, a distance between two adjacent spaced strips decreases from a center of the bending area to the non-bending area.

According to an embodiment of this application, a thickness of the second support base plate in the central area of the bending area is less than a thickness of the second support base plate in each of areas on two sides of the bending area.

According to an embodiment of this application, the hollowed-out structure is in one or more of an elliptical shape, a rhombus shape, or a wave shape.

According to an embodiment of this application, the hollowed-out structure has a first stretching direction, and the first stretching direction is perpendicular to a bending direction of the bending area.

According to an embodiment of this application, the support base plate further comprises an adhesive layer, and the adhesive layer is disposed around the bending area and disposed between the two-layer structure.

According to a second aspect of the embodiments of this application, a support base plate is provided, comprising: a bending area and a non-bending area, where the bending area is disposed on a side of the non-bending area, and the support base plate correspondingly disposed in the bending area comprises at least two layers, and at least one of the two layers is a hollowed-out structure.

According to an embodiment of this application, the corresponding support base plate in the bending area comprises a first support base plate and a second support base plate, the second support base plate is disposed on the first support base plate, and an end portion of the first support base plate is connected to a base plate in the non-bending area.

According to an embodiment of this application, the first support base plate and the second support base plate are both hollowed out to be meshy, and a hollowed-out area of the first support base plate is opposite to a non-hollowed-out area of the second support base plate.

According to an embodiment of this application, the first support base plate is meshy, and the second support base plate is in shape of spaced-strips.

According to an embodiment of this application, a distance between two adjacent spaced strips decreases from a center of the bending area to the non-bending area.

According to an embodiment of this application, a thickness of the second support base plate in the central area of the bent area is less than a thickness of the second support base plate in each of areas on two sides of the bending area.

According to an embodiment of this application, the hollowed-out structure is in one or more of an elliptical shape, a rhombus shape, or a wave shape.

According to an embodiment of this application, the hollowed-out structure has a first stretching direction, and the first stretching direction is perpendicular to a bending direction of the bending area.

According to an embodiment of this application, the support base plate further comprises an adhesive layer, and the adhesive layer is disposed around the bending area and disposed between the two-layer structure.

According to a second aspect of the embodiments of this application, a display panel is further provided, comprising:
 a support base plate, comprising a bending area and a non-bending area, where the bending area is disposed on a side of the non-bending area; and
 a display module, disposed on the support base plate, where
 the support base plate correspondingly disposed in the bending area comprises at least two layers, at least one of the two layers is a hollowed-out structure, and the support base plate is the support base plate provided in the embodiment of this application, the support base plate has better bending performance, and the corresponding display panel has better bending performance.

According to an embodiment of this application, the hollowed-out structure is in one or more of an elliptical shape, a rhombus shape, or a wave shape.

Beneficial Effects

In conclusion, beneficial effects of this application are as follows:

The embodiments of this application provide a support base plate and a display panel. In the embodiment of this application, the structure of the support base plate corresponding to the bending area of the display panel is improved, the support base plate in the bending area is disposed as a two-layers structure, and the support base plate in this area is a hollowed-out structure. Since the support base plate in the bent area is hollowed-out, when the support base plate is bent, the support base plate can be bent under the action of a less bending stress. In addition, during the bending, a flexible screen is also bent with the bending of the support base plate, and a flexible display panel has better bending performance and a better bending effect.

DETAILED DESCRIPTION OF PREFERRED EMBODIMENTS

The following description of various embodiments is provided to exemplify the specific embodiments of the disclosure with reference to accompanying drawings.

With the continuous expansion of an application range of a flexible display panel, people hope to prepare and obtain a flexible display panel having better bending or folding performance, so as to further improve the bending or folding performance of the flexible display panel. The embodiments of this application provide a support base plate and a display panel. By improving the structure of the support base plate, the problems of a flexible screen of the flexible display panel being prone to warp during the bending, an unsatisfactory bending effect, and the like can be effectively avoided. Therefore, the overall performance of the display panel is effectively improved.

Figure 1:
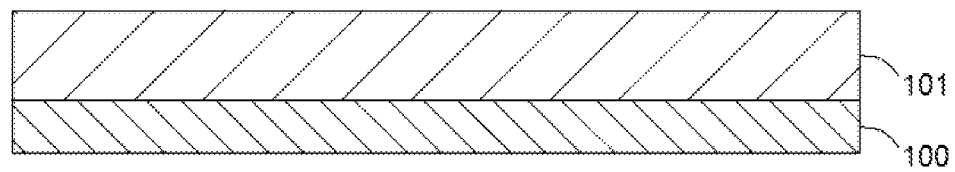
FIG. 1 is a schematic diagram of a film layer structure of a flexible display panel in the conventional art.

As shown in FIG. 1, FIG. 1 is a schematic diagram of a film layer structure of a flexible display panel in the related art. Specifically, the flexible display panel includes a substrate base plate 100 and a display module 101.

The display module 101 is disposed on the substrate base plate 100, and the display module 101 is supported using the substrate base plate 100. When the flexible display module 101 is bent or folded under a force, on the one hand, the substrate base plate 100 can effectively support the flexible display module 101. On the other hand, the substrate base plate 100 is bent under the action of a bending stress, and the flexible display module 101 disposed on the substrate base plate is bent accordingly. This in turn causes the entire display panel to be bent.

However, the substrate base plate 100 disposed in the related art generally has a relatively large rigidity, and a relatively large bending resistance exists inside the substrate base plate 100 when being subjected to a force. This is not conducive to the improvement of the bending performance of the flexible display panel.

Figure 2:
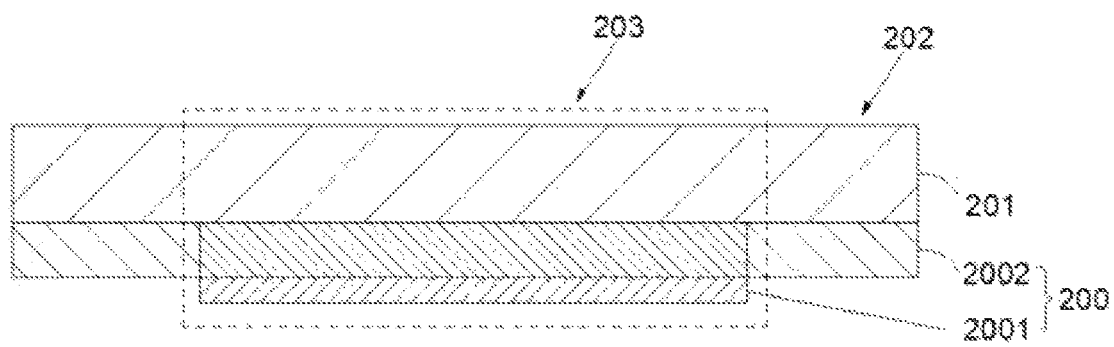
FIG. 2 is a schematic diagram of a film layer structure of a flexible display panel according to an embodiment of this application.

As shown in FIG. 2, FIG. 2 is a schematic diagram of a film layer structure of a flexible display panel according to an embodiment of this application. The flexible display panel includes a bending area 203 and a non-bending area 202. The non-bending area 202 is disposed on a side of the bending area 203. In the embodiment of this application, the non-bending area 202 surrounding a periphery of the bending area 203 is used as an example for description.

Specifically, the flexible display panel further includes a substrate layer and a flexible display module 201. In the embodiment of this application, the substrate layer being a support base plate 200 is used as an example for description. The flexible display module 201 is disposed on the support base plate 200. On the one hand, the support base plate 200 is configured to fix and support the flexible display module 201. On the other hand, the support base plate 200 is bent or folded in the bending area 203 of the flexible display panel, thereby causing the flexible display module in the corresponding area to be bent.

In order to improve the bending performance of the flexible display panel and effectively resolve the problem that the flexible display panel is prone to warp and break when being bent, the structure of the support base plate 200 is improved in the embodiment of this application. The support base plate 200 in the embodiment of this application is disposed as a structure including at least two layers. Specifically, the support base plate 200 having a two-layer structure in the embodiment of this application is used as an example for description. The support base plate 200 may also have three or more layers, and an implementation and design principles therefor are the same as or similar to the structure of the support base plate 200 provided in the embodiment of this application. Details are not described again.

The support base plate 200 includes a first support base plate 2001 and a second support base plate 2002. The second support base plate 2002 is disposed on the first support base plate 2001. The flexible display module 201 is disposed on the second support base plate 2002. The flexible display module 201 can be supported by using the support base plate 200.

Further, the first support base plate 2001 in the embodiment of this application is at least disposed at a corresponding position in the bending area 203 of the flexible display panel. In disposing the first support base plate 2001, an area of the first support base plate 2001 is less than an area of the second support base plate 2002. In addition, the first support base plate 2001 is disposed only in the bending area 203. When the display panel is bent, the first support base plate 2001 is bent accordingly.

In addition, the second support base plate 2002 is disposed on the first support base plate 2001. The second support base plate 2002 in the embodiment of this application is disposed as a hollowed-out structure. In disposing the second support base plate 2002, the hollowed-out structure of the second support base plate 2002 is correspondingly disposed only in the bending area 203 to reduce the difficulty of the preparing process.

When the hollowed-out structure of the second support base plate 2002 is disposed in the corresponding position of the bending area 203, in the non-bending area 202, the second support base plate 2002 may be disposed as a solid non-hollowed-out structure, and an end portion of the hollowed-out structure is connected to the non-hollowed-out structure, thereby forming a complete support structure film layer to effectively support the flexible display module 201.

Since the bent area 203 corresponding to the second support base plate 2002 in the embodiment of this application is disposed as a hollowed-out structure, in the embodiment of this application, the hollowed-out structure being a hollowed-out grid is used as an example for description. The hollowed-out structure can be further in other hollowed-out shapes.

Figure 3:
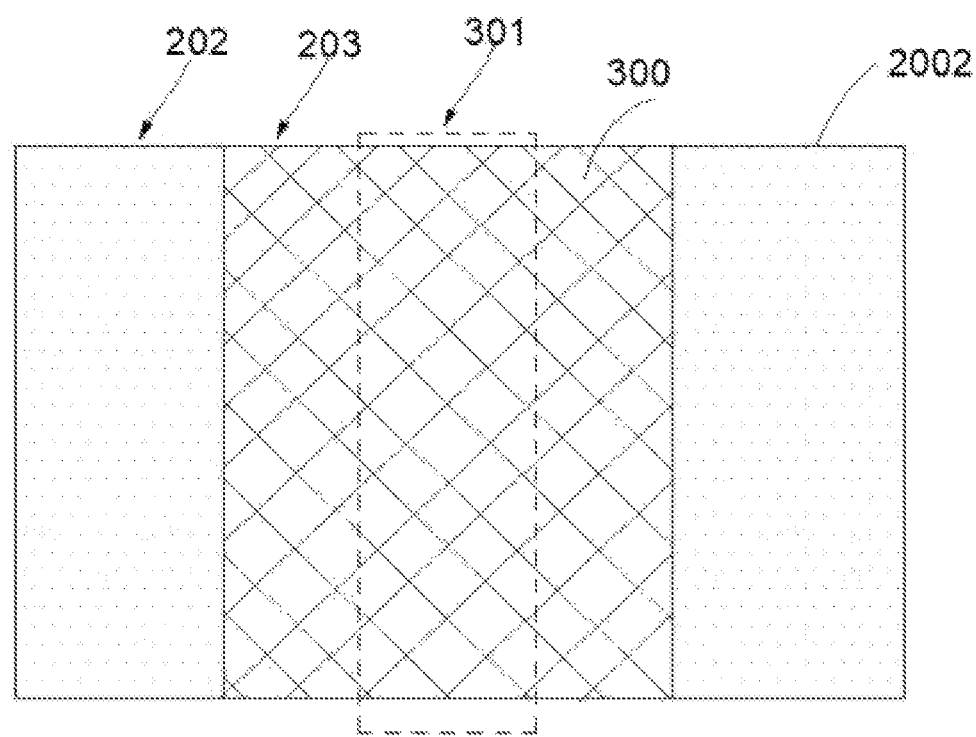
FIG. 3 is a schematic structural diagram of a second support base plate according to an embodiment of this application.

As shown in FIG. 3, FIG. 3 is a schematic structural diagram of a second support base plate 2002 according to an embodiment of this application. In the bending area 203, the second support base plate 2002 includes a grid-shaped hollowed-out structure 300. In order to improve the bending performance of the second support base plate 2002, in disposing the grid-shaped hollowed-out structure 300, a grid density is reduced in a central area 301 of the bending area 203. That is to say, the grid density in the central area 301 is less than a grid density in a non-central area. Alternatively, a grid area in the central area 301 is increased, so that an area of a single grid in the central area 301 is greater than a grid area in the non-central area. Since the grid density in the central area 301 is small, the grid is prone to bend when being stressed, thereby effectively improving the bending or folding performance of the flexible display panel.

When the first support base plate 2001 and the second support base plate 2002 are both disposed as a hollowed-out structure, when the two support base plates are pasted, the hollowed-out area of the first support base plate 2001 is opposite to the non-hollowed-out area of the second support base plate 2002. In this way, the supporting effect of the support base plate can be improved while ensuring the bending performance of the support base plate, thereby improving the bending performance of the flexible display panel.

Figure 4:
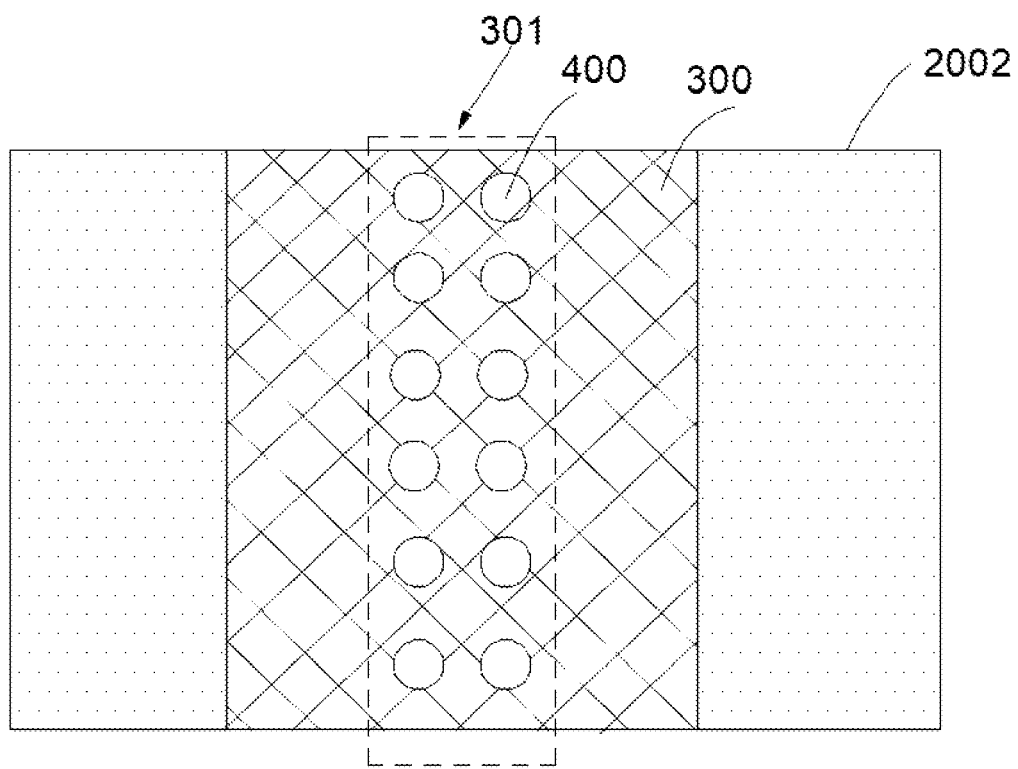
FIG. 4 is another schematic structural diagram of a second support base plate according to an embodiment of this application.

The corresponding hollow in FIG. 3 is a grid-shaped hollowed-out structure. The shape of the above grid can be further disposed to be an ellipse, a rhombus, or the like. As shown in FIG. 4, FIG. 4 is another schematic structural diagram of a second support base plate 2002 according to an embodiment of this application. In a central area 301, the hollowed-out structure further includes a circular hollow 400, and a plurality of circular hollows 400 can be arranged in an array. In this way, in the embodiment of this application, a plurality of hollowed-out structures is disposed in the central area 301. When the base plate is bent, different hollowed-out structures can be subjected to different stresses. Different hollowed-out structures can effectively act on bending stresses in different directions. Therefore, the bending performance of the second support base plate 2002 can be effectively improved.

Preferably, the hollowed-out grid can be further disposed in a wave shape. A plurality of wave-shaped grids is spaced apart from each other and arranged in an array in the central area 301. A length direction of the wave shape is the same as a length direction of the second support base plate 2002. In this way, when the base plate s bent, the second support base plate 2002 is more prone to bend.

Figure 5:
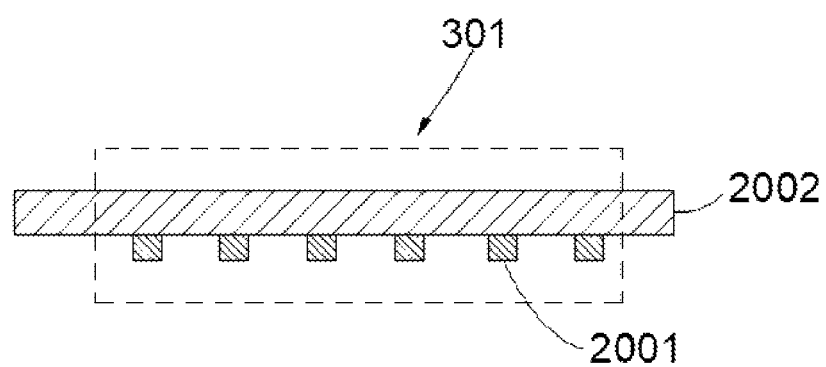
FIG. 5 is a schematic structural diagram of a support base plate according to an embodiment of this application.
Figure 6:
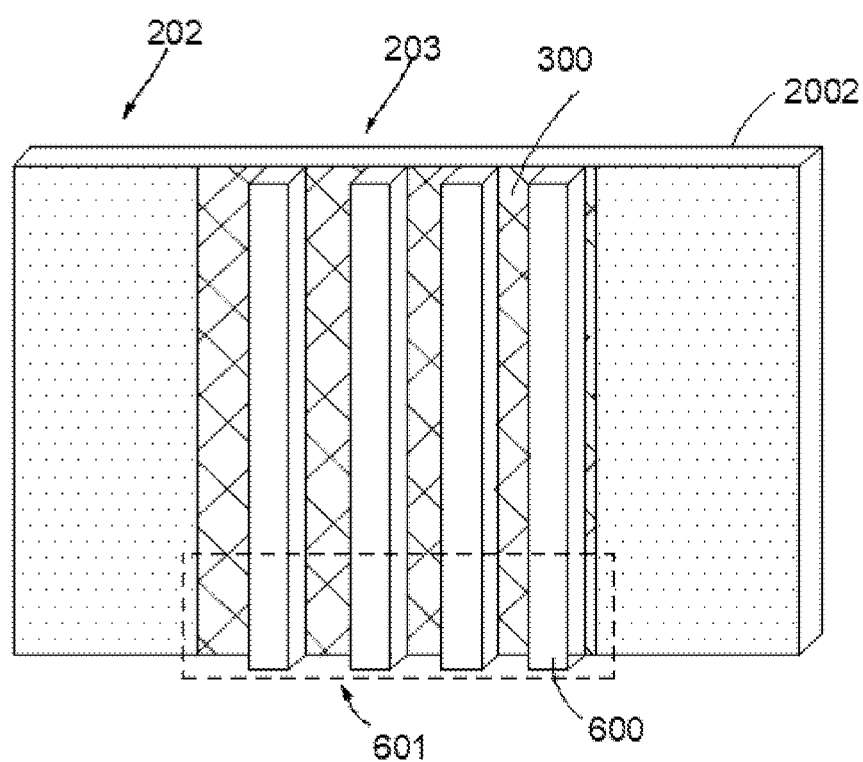
FIG. 6 is a top view of the support base plate according to an embodiment of this application.

Further, as shown in FIG. 5 and FIG. 6, FIG. 5 is a schematic structural diagram of a support base plate according to an embodiment of this application, and FIG. 6 is a top view of the support base plate according to an embodiment of this application. In disposing the first support base plate 2001, the first support base plate 2001 can be disposed as a strip-shaped structure 600. A plurality of strip-shaped structures 600 is disposed on a side of the second support base plate 2002 at intervals.

In disposing the strip-shaped structure 600, a length direction of the strip-shaped structure 600 is perpendicular to a bending direction of the second support base plate 2002. In addition, two adjacent strip-shaped structures 600 can be disposed at equal distances. Since the first support base plate 2001 is a strip-shaped structure 600, and there is a specific distance between two adjacent strip-shaped structures 600, when the support base plate is bent or folded, on the one hand, the strip-shaped structure 600 can support the second support base plate 2002 in the length direction. On the other hand, a spacing between the strip-shaped structures 600 will not affect the bending of the support base plate. Therefore, the support base plate provided in the embodiments of this application not only can support a plurality of flexible display modules, but also can effectively improve the bending performance of the support base plate. Finally, various performances of the flexible display panel are effectively improved.

Preferably, when a plurality of strip-shaped structures 600 is disposed, a distance between two adjacent strip-shaped structures 600 can gradually decrease from the center of the bending area to the non-bending area. That is to say, the strip-shaped structure in the center of the bending area is sparsely disposed, and the strip-shaped structure in the non-central area is denser, thereby effectively improving the bending performance of the flexible display panel.

Figure 7:
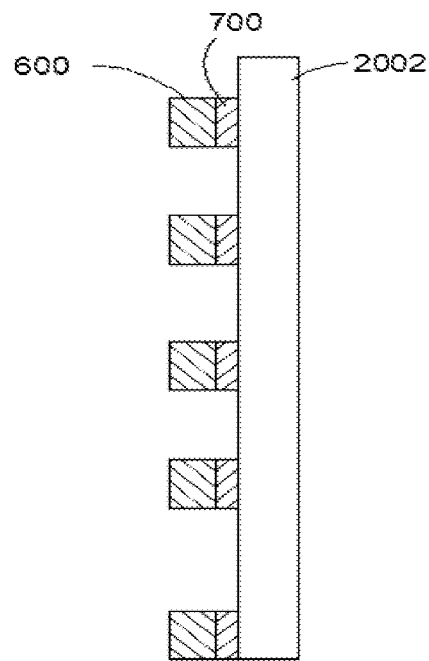
FIG. 7 is a side view of a support base plate in an edge area according to an embodiment of this application.

Further, as shown in FIG. 7, FIG. 7 is a side view of a support base plate in an edge area 601 according to an embodiment of this application. In disposing the strip-shaped structures 600, the flexible display panel further includes an adhesive layer 700. The adhesive layer 700 is disposed between the strip-shaped structure 600 and the second support base plate 2002. The strip-shaped structure 600 is bonded to the second support base plate 2002 using the adhesive layer 700 to form the support base plate provided in the embodiment of this application.

The adhesive layer 700 can be disposed only in the edge area 601 to achieve the purpose of saving adhesive materials. In the embodiment of this application, since the bending area of the second support base plate 2002 is hollowed out, in order to improve the recovery performance of the second support base plate 2002, a glue layer may further be filled in each hollowed-out grid. When the hollowed-out grid is bent or folded, since the filled adhesive layer has a better resilience, under the action of the adhesive layer, the support base plate can better return to a flat state. Therefore, the support base plate provided in the embodiment of this application not only has a desirable bending performance, but also has a desirable recovery performance. When the flexible display panel is bent a plurality of times, the flexible panel still has a desirable recovery performance.

Figure 8:
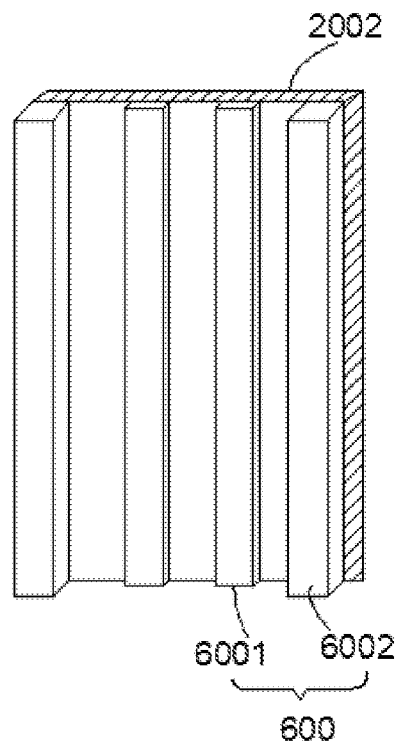
FIG. 8 is a schematic top view of the support base plate in FIG. 7 according to an embodiment of this application.

As shown in FIG. 8, FIG. 8 is a schematic top view of the support base plate in FIG. 7 according to an embodiment of this application. When the flexible display panel is bent or folded, the support base plates in different areas bear different bending stresses during the bending. Therefore, the bending or folding conditions of the corresponding flexible display panels in different areas are also different.

In the embodiment of this application, in designing the support base plate, the first support base plate 2001 includes a center support bar 6001 and an edge support bar 6002. The center support bar 6001 is disposed at a corresponding position of the center of the bending area of the flexible display panel, and the edge support bar 6002 is disposed at a position close to a side of the non-bending area.

In addition, a height of the center support bar 6001 and a height of the edge support bar 6002 can be different. Due to the different forces in the bending area during bending, the central area is subjected to large forces, while the edge area is subjected to small forces. Therefore, in the embodiment of this application, the height of the center support bar 6001 is less than the height of the edge support bar 6002. Preferably, the height of the center support bar 6001 can be half the height of the edge support bar 6002. Since a thickness of the center support bar 6001 is less, the center support bar is more prone to bend during the bending. In this way, the support base plate provided in the embodiments of this application not only can effectively ensure that the center support bar 6001 has a desirable support effect on the flexible display panel, but also can improve the bending performance of the support base plate. Therefore, various performances of the flexible display panel are effectively improved.

Further, in the embodiment of this application, in disposing the center support bar, since the height of the center support bar 6001 corresponding to the central area is less than the height of the edge support bar 6002, in order to ensure the uniformity of the overall thickness of the film layer, in the embodiment of this application, support bars of another support structure may be disposed on the corresponding center support bar 6001 in the central area. A width of the support bar is less than a width of the center support bar 6001. In this way, another support structure is disposed on the center support bar 6001 to enhance the support performance of the center support bar 6001. When the flexible display panel is bent or folded, since the strength of the center support bar 6001 is enhanced, the support base plate not only has a better support performance for the flexible display panel, but also has a better bending performance.

Preferably, when a plurality of first support base plates provided in the embodiments of this application is disposed, an adhesive glue may be disposed between the plurality of support bars, and adjacent support bars are connected using the adhesive glue. When the base plate is bent, under the action of the adhesive glue, no misalignment occurs between the adjacent support bars, thereby ensuring the support performance and bending performance of the first support base plate provided in the embodiments of this application. Therefore, the folding or bending performance of the flexible display panel is effectively improved.

The embodiments of this application further provide a display panel and a display device. The display panel includes a support base plate and a display module, and the display panel includes a bending area and a non-bending area. The support base plate disposed in the display panel is the support base plate provided in the embodiments of this application. The support base plate includes an at least two-layer structure. At least one layer in the two-layer structure is a hollowed-out structure, and another layer is a support strip-shaped structure. In addition, the support base plate may further be alternately disposed by means of recombination a plurality of times, so as improve the overall performance of the flexible display panel. When the flexible display panel is bent or folded, the display panel or the display device has better bending and folding performance. The display device provided in the embodiment of this application may be a flexible liquid crystal display, and can further be a foldable mobile phone, a computer, a smart wearable display device, or the like. The embodiment of this application does not specifically limit the display device.

A support base plate and a display panel provided in the embodiments of this application are described above in detail. Although the principles and implementations of the present disclosure are described by using specific examples in this specification, the descriptions of the foregoing embodiments are merely used for helping understand the technical solutions and the core idea of the technical solutions of this application. A person of ordinary skill in the art should understand that modifications may be still made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A support base plate, comprising:
   a base plate, comprising a non-bending area and a bending area disposed on a side of the non-bending area, and comprising a hollow structure corresponding to the bending area; and
   a plurality of strips, arranged at intervals on a side of the base plate and corresponding to the bending area,
   wherein each of the strips extends along a direction parallel to a bending axis of the base plate, the hollow structure is grid-shaped, and a grid density of the hollow structure increases along a direction from a center of the bending area towards a periphery of the bending area.

2. The support base plate according to claim 1, wherein along a direction from a center of the bending area towards a periphery of the bending area, a distance between two adjacent ones of the plurality of strips decreases.

3. The support base plate according to claim 1, wherein the plurality of strips comprises center strips disposed in a center of the bending area and edge strips disposed in a periphery of the bending area, and a thickness each of the center strips is less than a thickness of each of the edge strips.

4. The support base plate according to claim 1, wherein the plurality of strips are bonded to the base plate through an adhesive layer.

5. The support base plate according to claim 4, wherein the adhesive layer is disposed between ends of the plurality of strips and the base plate.

6. The support base plate according to claim 1, wherein the hollow structure further comprises circular hollows arranged in an array in a center area of the bending area.

7. The support base plate according to claim 1, wherein the hollowed structure has a first stretching direction perpendicular to a bending direction of the bending area.

8. A display panel, comprising:
   a support base plate, comprising:
      a base plate, comprising a non-bending area and a bending area disposed on a side of the non-bending area, and comprising a hollow structure corresponding to the bending area; and
      a plurality of strips, arranged at intervals on a side of the base plate and corresponding to the bending area; and
   a display module, carried on a side of the base plate facing away from the plurality of strips,
   wherein each of the strips extends along a direction parallel to a bending axis of the base plate, the hollow structure is grid-shaped, and a grid density of the hollow structure increases along a direction from a center of the bending area towards a periphery of the bending area.

9. The display panel according to claim 8, wherein along a direction from a center of the bending area towards a periphery of the bending area, a distance between two adjacent ones of the plurality of strips decreases.

10. The display panel according to claim 8, wherein the plurality of strips comprises center strips disposed in a center of the bending area and edge strips disposed in a periphery of the bending area, and a thickness each of the center strips is less than a thickness of each of the edge strips.

11. The display panel according to claim 8, wherein the plurality of strips are bonded to the base plate through an adhesive layer.

12. The display panel according to claim 11, wherein the adhesive layer is disposed between ends of the plurality of strips and the base plate.

13. The display panel according to claim 8, wherein the hollow structure further comprises circular hollows arranged in an array in a center area of the bending area.

14. The display panel according to claim 8, wherein the hollowed structure has a first stretching direction perpendicular to a bending direction of the bending area.

15. A support base plate, applied in a display panel comprising a display module, and comprising:
   a base plate, configured to carry the display module, comprising a non-bending area and a bending area disposed on a side of the non-bending area, and comprising a hollow structure corresponding to the bending area; and
   a plurality of strips, arranged at intervals on a side of the base plate and corresponding to the bending area,
   wherein each of the strips extends along a direction parallel to a bending axis of the base plate, the hollow structure is grid-shaped, and a grid density of the hollow structure increases along a direction from a center of the bending area towards a periphery of the bending area.

* * * * *